(12) United States Patent
Chen et al.

(10) Patent No.: US 11,776,862 B2
(45) Date of Patent: Oct. 3, 2023

(54) LID STRUCTURE AND SEMICONDUCTOR DEVICE PACKAGE INCLUDING THE SAME

(71) Applicant: Advanced Semiconductor Engineering, Inc., Kaohsiung (TW)

(72) Inventors: Chun-Han Chen, Kaohsiung (TW); Hsun-Wei Chan, Kaohsiung (TW); Mei-Yi Wu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 385 days.

(21) Appl. No.: 17/027,408

(22) Filed: Sep. 21, 2020

(65) Prior Publication Data

US 2021/0005522 A1 Jan. 7, 2021

Related U.S. Application Data

(63) Continuation of application No. 15/294,598, filed on Oct. 14, 2016, now Pat. No. 10,804,173.

(Continued)

(51) Int. Cl.
*H01L 23/10* (2006.01)
*H01L 23/04* (2006.01)
(Continued)

(52) U.S. Cl.
CPC ............. *H01L 23/10* (2013.01); *H01L 23/04* (2013.01); *H01L 24/48* (2013.01);
(Continued)

(58) Field of Classification Search
CPC ......... H01L 23/02; H01L 23/04; H01L 23/10; H01L 23/3121; H01L 23/3107;
(Continued)

(56) References Cited

U.S. PATENT DOCUMENTS 4,410,905 A 10/1983 Grabbe
5,446,316 A 8/1995 Temple et al.
(Continued)

FOREIGN PATENT DOCUMENTS

CN 102428375 A 4/2012
TW 200933765 A 8/2009
(Continued)

OTHER PUBLICATIONS

Final Office Action for U.S. Appl. No. 15/294,598, dated Feb. 21, 2020, 11 pages.
(Continued)

*Primary Examiner* — Dale E Page
*Assistant Examiner* — Quovaunda Jefferson
(74) *Attorney, Agent, or Firm* — FOLEY & LARDNER LLP

(57) ABSTRACT

The present disclosure relates to a semiconductor device package, which includes a carrier, a lid, a first adhesive layer and a constraint structure. The carrier includes a surface and a first conductive pad on the surface of the carrier. The lid includes a first portion and a second portion separated from the first portion on the surface of the carrier. The first conductive pad is disposed between the first portion of the lid and the surface of the carrier. The first adhesive layer includes a first portion between the first portion of the lid and the first conductive pad. The constraint structure surrounds the first adhesive layer.

7 Claims, 6 Drawing Sheets

Related U.S. Application Data

(60) Provisional application No. 62/242,806, filed on Oct. 16, 2015.

(51) Int. Cl.
    *H01L 25/065*     (2023.01)
    *H01L 23/00*     (2006.01)

(52) U.S. Cl.
    CPC .............. *H01L 25/0655* (2013.01); *H01L 2224/48091* (2013.01); *H01L 2224/48227* (2013.01); *H01L 2924/00014* (2013.01); *H01L 2924/164* (2013.01); *H01L 2924/16153* (2013.01)

(58) Field of Classification Search
    CPC ... H01L 24/48; H01L 25/0655; H01L 25/071; H01L 2224/48091; H01L 2224/48227; H01L 2924/00014; H01L 2924/16153; H01L 2924/164
    See application file for complete search history.

(56) References Cited

U.S. PATENT DOCUMENTS

| | | | |
|---|---|---|---|
| 6,518,660 B2 * | 2/2003 | Kwon | H01L 23/49838 |
| | | | 257/E23.079 |
| 6,952,046 B2 | 10/2005 | Farrell et al. | |
| 7,629,674 B1 | 12/2009 | Foster | |
| 8,362,597 B1 | 1/2013 | Foster | |
| 2002/0113306 A1 | 8/2002 | Kwon et al. | |
| 2004/0016995 A1 | 1/2004 | Kuo et al. | |
| 2005/0260797 A1 | 11/2005 | Farrell et al. | |
| 2009/0057884 A1 | 3/2009 | Too et al. | |
| 2009/0152688 A1 | 6/2009 | Do et al. | |
| 2011/0115036 A1 * | 5/2011 | Moon | H01L 21/6835 |
| | | | 257/E23.023 |
| 2012/0133042 A1 | 5/2012 | Hayashi et al. | |
| 2015/0043171 A1 | 2/2015 | Mugiya et al. | |
| 2021/0242098 A1 * | 8/2021 | Sinha | H01L 21/52 |

FOREIGN PATENT DOCUMENTS

| | | |
|---|---|---|
| WO | WO-2006/112576 A1 | 10/2006 |
| WO | WO-2011/103720 A1 | 9/2011 |

OTHER PUBLICATIONS

Final Office Action for U.S. Appl. No. 15/294,598, dated Sep. 26, 2018, 17 pages.
Final Office Action for U.S. Appl. No. 15/294,598, dated Sep. 29, 2017, 14 pages.
Foreign Action other than Search Report on non-Foley case related to U.S. Appl. No. 15/294,598 dated Apr. 29, 2020.
Non-Final Office Action for U.S. Appl. No. 15/294,598, dated Apr. 10, 2017, 11 pages.
Non-Final Office Action for U.S. Appl. No. 15/294,598, dated Apr. 3, 2018, 14 pages.
Non-Final Office Action for U.S. Appl. No. 15/294,598, dated Aug. 8, 2019, 10 pages.
Non-Final Office Action for U.S. Appl. No. 15/294,598, dated Jan. 18, 2019, 10 pages.
Notice of Allowance for U.S. Appl. No. 15/294,598, dated Jun. 10, 2020, 8 pages.
Office Action and Search Report from corresponding Taiwan Patent Application No. 105133358, dated Apr. 29, 2020, 14 pages.
Office Action for corresponding Chinese Patent Application No. 201610897847.3, dated Aug. 5, 2019, 5 pages.
Office Action for corresponding Chinese Patent Application No. 201610897847.3, dated Aug. 5, 2019, 8 pages.
Search Report with English translation from corresponding Taiwan Patent Application No. 105133358, dated Apr. 29, 2020, 3 pages.

* cited by examiner

LID STRUCTURE AND SEMICONDUCTOR DEVICE PACKAGE INCLUDING THE SAME

CROSS-REFERENCE TO RELATED APPLICATION

This application is a continuation of U.S. patent application Ser. No. 15/294,598 filed Oct. 14, 2016, which claims the benefit of and priority to U.S. Provisional Application No. 62/242,806, filed Oct. 16, 2015, the contents of which are incorporated herein by reference in their entirety.

BACKGROUND

1. Technical Field

The present disclosure relates to a semiconductor device package, and more particularly to a semiconductor device package including a lid structure.

2. Description of the Related Art

In a process of packaging semiconductor devices, a lid is used to protect a die and other electronic devices on a substrate from damage. The lid is glued to the substrate to form a semiconductor device package.

SUMMARY

In one or more embodiments, a semiconductor device package includes a carrier, a lid, a first adhesive layer and a constraint structure. The carrier includes a surface and a first conductive pad on the surface of the carrier. The lid includes a first portion and a second portion separated from the first portion on the surface of the carrier. The first conductive pad is disposed between the first portion of the lid and the surface of the carrier. The first adhesive layer includes a first portion between the first portion of the lid and the first conductive pad. The constraint structure surrounds the first adhesive layer.

In one or more embodiments, a lid for a semiconductor device package includes a base portion, a first portion and a second portion. The first portion extends from the base portion in a direction. The second portion extends from the base portion in the direction and is surrounded by the first portion. The base portion, the first portion and the second portion define a trench between the first portion and the second portion and separating the first portion from the second portion.

In one or more embodiments, a semiconductor device package includes a carrier, a lid, an electronic component and a conductive adhesive layer between the lid and the carrier. The lid is disposed on the carrier and defines a space and a trench. The electronic component is disposed on the carrier in the space.

BRIEF DESCRIPTION OF THE DRAWINGS

Aspects of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
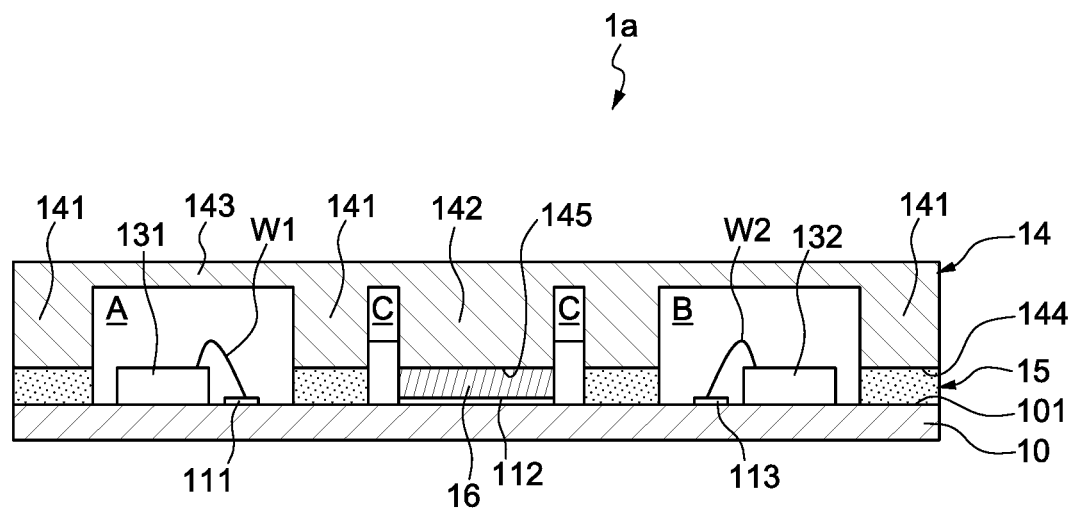
FIG. 1A is a cross-sectional view of a semiconductor device package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over", "above," "upper", "on" and the like, may be used herein for ease of description to describe one component or feature's relationship to another component(s) or feature(s) as illustrated in the figures. The present disclosure is intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In some sensor devices, a lid of a device includes a conductive material, such that when the lid is touched, electricity is conducted to a substrate on which the lid is disposed. To provide a conductive path between the lid and the substrate, a conductive adhesive material (e.g., a conductive epoxy) may be applied between the lid and the substrate, such as applied on bonding pads or other conductive areas of the substrate. Additionally, a non-conductive adhesive material (e.g., a non-conductive epoxy) may be applied between the lid and the substrate to attach the lid to the substrate. The non-conductive adhesive material may be applied between the lid and the substrate wherever the conductive adhesive material is not present, or may be applied at various positions along the lid.

One or both of the conductive adhesive material and the non-conductive adhesive material may bleed past an intended disposition area. Further, when the conductive adhesive material and the non-conductive adhesive material come into contact with each other, the conductive adhesive material and the non-conductive adhesive material may diffuse together, or one of the conductive adhesive material and the non-conductive adhesive material may bleed into the other. Bleeding and/or diffusing can cause, for example, an open circuit, a short circuit, or poor adhesion, which can lead to reliability concerns.

FIG. 1A is a cross-sectional view of a semiconductor device package 1a in accordance with some embodiments of the present disclosure. As shown in FIG. 1A, the semiconductor device package 1a includes a carrier 10, dies 131 and 132 and a lid 14.

The carrier 10 may be a substrate which has a top surface 101. The carrier 10 includes bonding pads 111, 112 and 113 on the surface 101. The bonding pads 111, 112 and 113 are electrically conductive, and may also be referred to as conductive pads. The bonding pad 111 is configured to electrically connect to the die 131. The bonding pad 112 is configured to electrically connect to the lid 14. The bonding pad 112 is used to conduct an electrical signal, which is different from a ground signal. The bonding pad 112 is used to conduct an electrical signal between the lid 14 and the carrier 10; for example, the bonding pad 112 is used to receive an electrical signal from the lid 14, which is electrically conductive. In operation, an initial electrical signal is transferred from the lid 14 to the die 131 or 132 on the carrier 10 through the bonding pad 112, an object (not shown in FIG. 1A) may subsequently contact the conductive lid 14 to change the electrical signal on the lid 14, and the changed electrical signal may be sent to the die 131 or 132 via the bonding pad 112. The carrier 10 includes an interconnection structure (e.g., traces, vias, and so forth) to electrically connect the die 131 or 132 to the bonding pad 112. The bonding pad 113 is configured to electrically connect to the die 132. The carrier 10 may be, for example, a printed circuit board, an interposer, a lead frame or any other suitable carrier. In other embodiments of the present disclosure, the bonding pad 112 may be grounded.

The dies 131 and 132 are disposed on the carrier 10. Each of the dies 131 and 132 is a wire-bond type chip or other electronic component. In other embodiments of the present disclosure, at least one of the dies 131 and 132 is a flip-chip type chip or other electronic component. A surface (not denoted) of each of the dies 131 and 132 is disposed directly on the surface 101 of the carrier 10 without an adhesive material. In other embodiments of the present disclosure, a surface (not denoted) of each of the dies 131 and 132 is attached to the surface 101 of the carrier 10 with an adhesive material (not shown), such as epoxy or other suitable adhesive material. At least one of the dies 131 and 132 is a sensor device to detect variation of electricity on the lid 14.

The conductive components W1 and W2 are illustrated in FIG. 1A as bond wires connecting the die 131 to the bonding pad 111 of the carrier 10 and connecting the die 132 to the bonding pad 113 of the carrier 10. It is to be understood, however, that other types of conductive components W1 and W2 may alternatively or additionally be used, such as, but not limited to, solder bumps, pillars, or the like. For example, contacts (not shown) may be disposed on a surface (not denoted) of each of the dies 131 and 132, and the conductive components W1 and W2 may electrically connect the contacts (not shown) on the surface of each of the dies 131 and 132 to the bonding pads 111 and 113 of the carrier 10, respectively. However, in other embodiments, the conductive components W1 and W2 are omitted, and the contacts (not shown) on the surface of each of the dies 131 and 132 are bonded directly to the bonding pads 111 and 113 of the carrier 10, such as by ultrasonic welding or other technique.

The lid 14 is electrically conductive, and includes an electrically conductive material. The lid 14 has a portion 141, a portion 142 and a base portion 143. The portion 141 extends from the base portion 143 in a direction (e.g., the portion 141 is downwardly extended from the base portion 143 as shown in FIG. 1A). The portion 142 extends from the base portion 143 in a direction (e.g., the portion 142 is downwardly extended from the base portion 143). As depicted in FIG. 1A, the portion 141 and the portion 142 extend from the base portion 143 in a same direction. The portion 141 is separated from the portion 142. The lid 14 defines a space A over the surface 101 of the carrier 10. The lid 14 defines a space B over the surface 101 of the carrier 10. The lid 14 also defines a trench C over the surface 101 of the carrier 10. The trench C is defined by the portion 141, the portion 142 and the base portion 143. The trench C separates the portion 141 and the portion 142, and is disposed between the portion 141 and the portion 142. The portion 141 of the lid 14 defines the space A. The space A accommodates the die 131, the bonding pad 111 and the conductive component W1. The portion 141 of the lid 14 also defines the space B. The space B accommodates the die 132, the bonding pad 113 and the conductive component W2. The portion 141 has a bottom surface 144 facing the surface 101 of the carrier 10. The portion 142 has a bottom surface 145 facing the surface 101 of the carrier 10.

A conductive adhesive layer 16 is disposed between the portion 142 of the lid 14 and the bonding pad 112 of the carrier 10. The conductive adhesive layer 16 is disposed on the bottom surface 145 of the portion 142 of the lid 14. The conductive adhesive layer 16 includes, or is formed from, an electrically conductive adhesive material. The conductive adhesive layer 16 electrically connects the portion 142 of the lid 14 to the bonding pad 112 of the carrier 10 such that a change of an electrical signal on the lid 14 may be detected by the die 131 or 132 via a conductive path formed by the lid 14, the conductive adhesive layer 16, the bonding pad 112 and the interconnection structure (not shown in FIG. 1A) of the carrier 10. A non-conductive adhesive layer 15 is disposed between the portion 141 of the lid 14 and the surface 101 of the carrier 10. The non-conductive adhesive layer 15 is disposed on the bottom surface 144 of the portion 141 of the lid 14 to firmly attach the lid 14 to the carrier 10. The non-conductive adhesive layer 15 is disposed between the lid 14 and the carrier 10 wherever the conductive adhesive layer 16 is not present. The non-conductive adhesive layer 16 includes, or is formed from, an electrically non-conductive or insulating adhesive material.

Figure 1B:
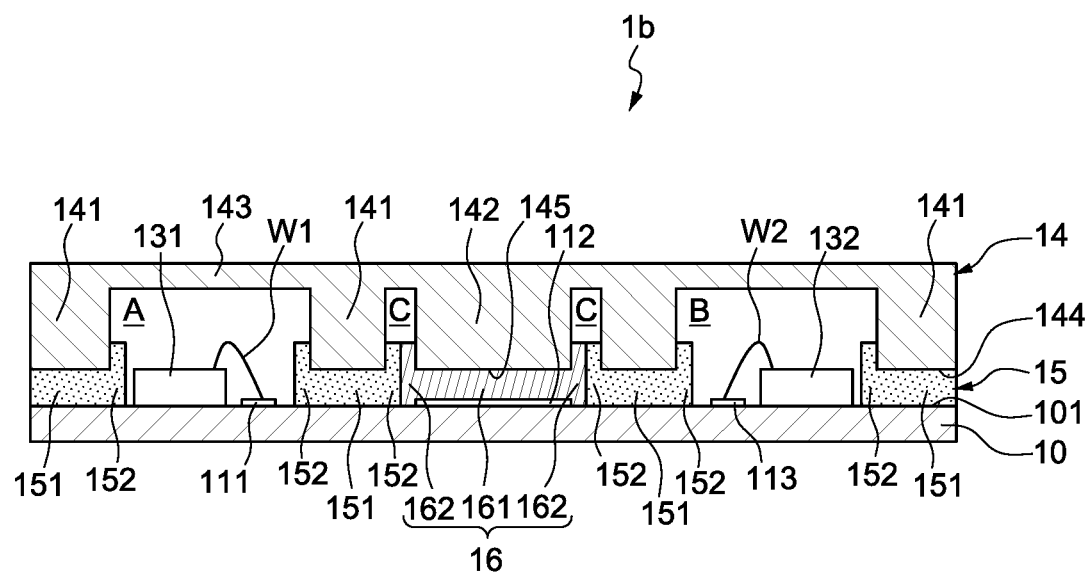
FIG. 1B is a cross-sectional view of a semiconductor device package in accordance with some embodiments of the present disclosure.
Figure 1C:
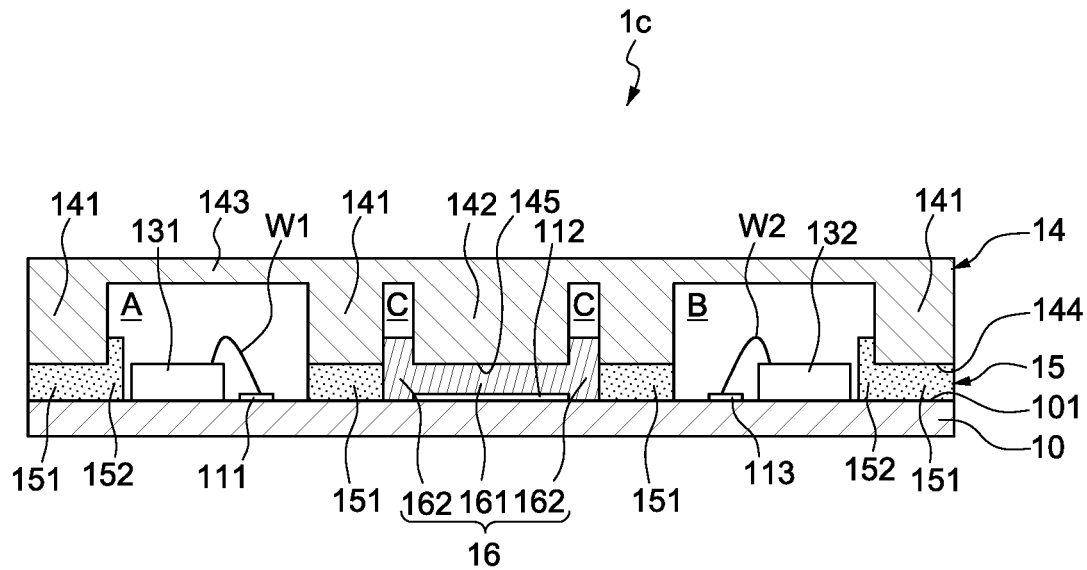
FIG. 1C is a cross-sectional view of a semiconductor device package in accordance with some embodiments of the present disclosure.
Figure 1D:
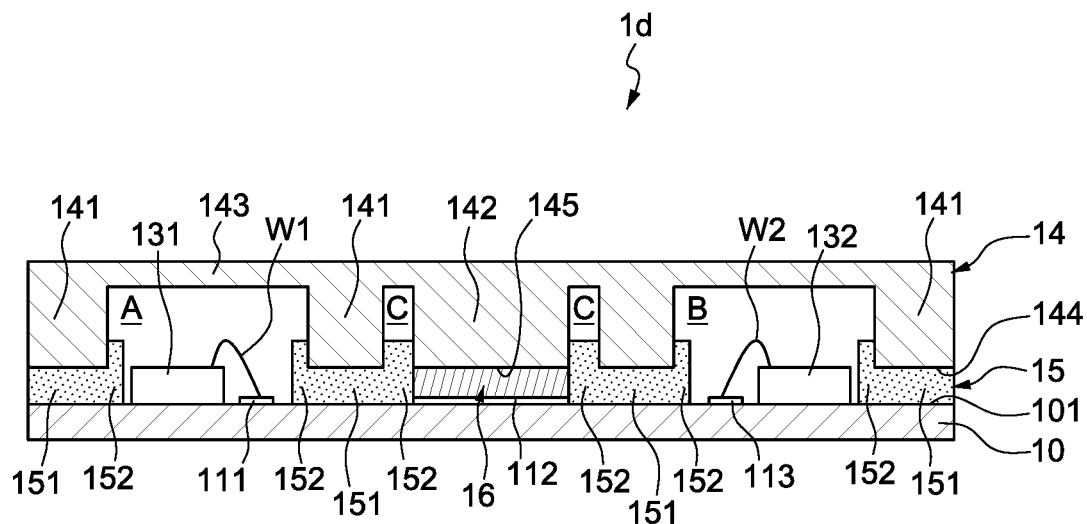
FIG. 1D is a cross-sectional view of a semiconductor device package in accordance with some embodiments of the present disclosure.
Figure 1E:
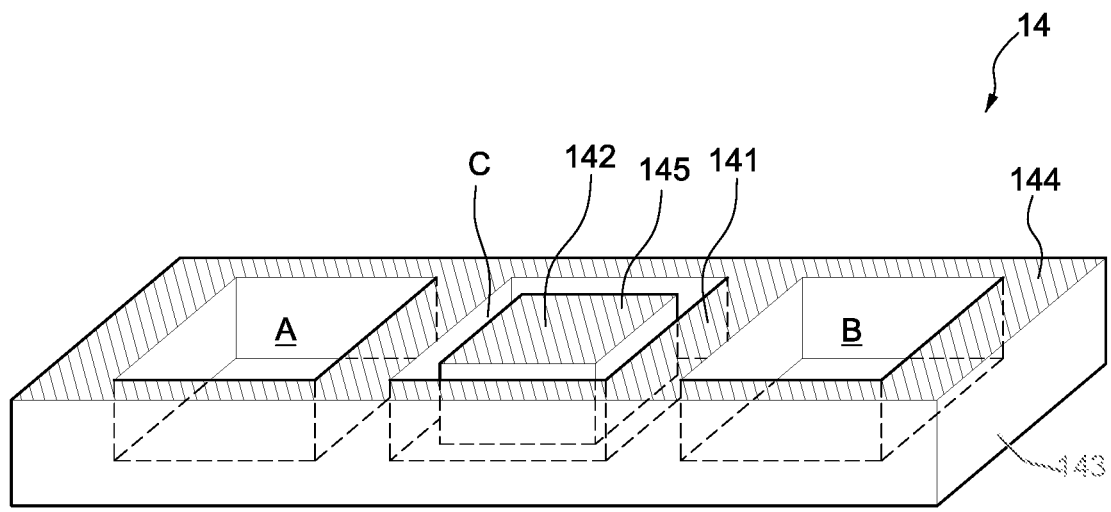
FIG. 1E is a perspective view of a lid structure in accordance with some embodiments of the present disclosure.

FIG. 1E is a perspective view of a structure of the lid 14 in accordance with some embodiments of the present disclosure. The portion 141 is separated from the portion 142 by the trench C. The trench C surrounds (e.g., fully surrounds) the portion 142. The portion 141 surrounds (e.g., fully surrounds) the portion 142. The trench C is defined by the portion 141, the portion 142 and the base portion 143. The trench C is between the portion 141 and the portion 142. The portion 141 of the lid 14 defines the space A. The portion 141 of the lid 14 also defines the space B. The portion 141 has the bottom surface 144. The portion 142 has the bottom surface 145. In an operation of attaching the lid 14 to the carrier 10 as illustrated and described with reference to FIG. 1A, the conductive adhesive material of the conductive adhesive layer 16 is applied on the bottom surface 145 of the portion 142 of the lid 14, the non-conductive adhesive material of the non-conductive adhesive layer 15 is applied on the bottom surface 144 of the portion 141 of the lid 14, and then the lid 14 is turned upside down and disposed on the surface 101 of the carrier 10 to form the semiconductor device package 1a. The material of the conductive adhesive layer 16 may be applied first, with the material of the non-conductive adhesive layer 15 applied in a subsequent stage. The material of the non-conductive adhesive layer 15 may be applied first, with the material of the conductive adhesive layer 16 applied in a subsequent stage. Alternatively, the materials of both the conductive adhesive layer 16 and the non-conductive adhesive layer 15 may be applied in a same stage.

Referring back to FIG. 1A, the material of the conductive adhesive layer 16 has a relatively high viscosity, is applied in a relatively small amount, or both. As such, the conductive adhesive layer 16 does not bleed or extend past an intended disposition area (e.g., the bonding pad 112). Also, the conductive adhesive layer 16 does not bleed or extend into the trench C. The conductive adhesive layer 16 is bounded by the trench C. Any excess of the conductive adhesive layer 16 is received by the trench C.

The material of the non-conductive adhesive layer 15 has a relatively high viscosity, is applied in a relatively small amount, or both. As such, the non-conductive adhesive layer 15 does not bleed or extend past an intended disposition area. Also, the non-conductive adhesive layer 15 does not bleed or extend into the trench C. The non-conductive adhesive layer 15 does not bleed or extend into the space A. The non-conductive adhesive layer 15 also does not bleed or extend into the space B. The non-conductive adhesive layer 15 is bounded by the trench C. Any excess of the non-conductive adhesive layer 15 is received by the trench C.

FIG. 1B is a cross-sectional view of a semiconductor device package 1b in accordance with some embodiments of the present disclosure. As shown in FIG. 1B, the semiconductor device package 1b is similar to the semiconductor device package 1a as illustrated and described with reference to FIG. 1A, except that the material of the conductive adhesive layer 16 has a relatively lower viscosity or is applied in a relatively greater amount, and the material of the non-conductive adhesive layer 15 has a relatively lower viscosity or is applied in a relatively greater amount.

The conductive adhesive layer 16 bleeds or extends past the intended disposition area (e.g., the bonding pad 112). The conductive adhesive layer 16 bleeds or extends into the trench C. Excess of the conductive adhesive layer 16 is received by the trench C. Excess of the conductive adhesive layer 16 is bounded by the trench C. The conductive adhesive layer 16 includes a portion 161 between the portion 142 of the lid 14 and the bonding pad 112. The conductive adhesive layer 16 also includes a portion 162 which bleeds or extends into the trench C. The portion 162 surrounds the portion 142 of the lid 14, and surrounds the portion 161. The trench C may serve as a constraint structure to constrain the conductive adhesive layer 16. The trench C may serve as a constraint structure to constrain the portion 162 of the conductive adhesive layer 16. The trench C receives the portion 162 of the conductive adhesive layer 16.

The non-conductive adhesive layer 15 bleeds or extends past the intended disposition area. The non-conductive adhesive layer 15 bleeds or extends into the trench C. The non-conductive adhesive layer 15 includes a portion 151 between the portion 141 of the lid 14 and the intended disposition area (not denoted). The non-conductive adhesive layer 15 surrounds the conductive adhesive layer 16. The non-conductive adhesive layer 15 also includes a portion 152 which bleeds or extends into the trench C, which bleeds or extends into the space A, and which bleeds or extends into the space B. The non-conductive adhesive layer 15 includes the portion 152 which bleeds or extends to surround parts of the portion 141 of the lid 14. The portion 152 surrounds parts of the portion 151. The portion 152 surrounds the portion 162. The trench C may serve as a constraint structure to constrain the portion 152 of the non-conductive adhesive layer 15. The non-conductive adhesive layer 15 may serve as a constraint structure to constrain the conductive adhesive layer 16. The portion 152 may serve as a constraint structure to constrain the conductive adhesive layer 16. The portion 152 may serve as a constraint structure to constrain the portion 162 of the conductive adhesive layer 16. The trench C receives the portion 152 of the non-conductive adhesive layer 15.

FIG. 1C is a cross-sectional view of a semiconductor device package 1c in accordance with some embodiments of the present disclosure. As shown in FIG. 1C, the semiconductor device package 1c is similar to the semiconductor device package 1a as illustrated and described with reference to FIG. 1A, except that the material of the conductive adhesive layer 16 has a relatively lower viscosity or is applied in a relatively greater amount, and the material of the non-conductive adhesive layer 15 has a relatively higher viscosity or is applied in a relatively smaller amount.

The conductive adhesive layer 16 bleeds or extends past the intended disposition area (e.g., the bonding pad 112). The conductive adhesive layer 16 bleeds or extends into the trench C. Excess of the conductive adhesive layer 16 is received by the trench C. Excess of the conductive adhesive layer 16 is bounded by the trench C. The conductive adhesive layer 16 includes the portion 161 between the portion 142 of the lid 14 and the bonding pad 112. The conductive adhesive layer 16 also includes the portion 162 which bleeds or extends into the trench C. The portion 162 surrounds the portion 142 of the lid 14, and surrounds the portion 161. The trench C may serve as a constraint structure to constrain the conductive adhesive layer 16. The trench C may serve as a constraint structure to constrain the portion 162 of the conductive adhesive layer 16. The trench C receives the portion 162 of the conductive adhesive layer 16.

The non-conductive adhesive layer 15 bleeds or extends past the intended disposition area. The non-conductive adhesive layer 15 includes the portion 151 between the portion 141 of the lid 14 and the intended disposition area (not denoted). The non-conductive adhesive layer 15 also includes the portion 152 which bleeds or extends into the space A, and which bleeds or extends into the space B. The non-conductive adhesive layer 15 includes the portion 152 which bleeds or extends to surround parts of the portion 141 of the lid 14. The portion 152 surrounds parts of the portion 151. The portion 151 surrounds the conductive adhesive layer 16. The trench C may serve as a constraint structure to constrain the portion 151 of the non-conductive adhesive layer 15. The non-conductive adhesive layer 15 may serve as a constraint structure to constrain the conductive adhesive layer 16. The portion 151 may serve as a constraint structure to constrain the conductive adhesive layer 16. The portion 151 may serve as a constraint structure to constrain the portion 162 of the conductive adhesive layer 16.

FIG. 1D is a cross-sectional view of a semiconductor device package 1*d* in accordance with some embodiments of the present disclosure. As shown in FIG. 1D, the semiconductor device package 1*d* is similar to the semiconductor device package 1*a* as illustrated and described with reference to FIG. 1A, except that the material of the conductive adhesive layer 16 has a relatively higher viscosity or is applied in a relatively smaller amount, and the material of the non-conductive adhesive layer 15 has a relatively lower viscosity or is applied in a relatively greater amount.

The conductive adhesive layer 16 does not bleed or extend past the intended disposition area (e.g., the bonding pad 112). Also, the conductive adhesive layer 16 does not bleed or extend into the trench C. The conductive adhesive layer 16 is bounded by the trench C. Any excess of the conductive adhesive layer 16 is received by the trench C.

The non-conductive adhesive layer 15 bleeds or extends past the intended disposition area. The non-conductive adhesive layer 15 bleeds or extends into the trench C. The non-conductive adhesive layer 15 includes the portion 151 between the portion 141 of the lid 14 and the intended disposition area (not denoted). The non-conductive adhesive layer 15 surrounds the conductive adhesive layer 16. The non-conductive adhesive layer 15 also includes the portion 152 which bleeds or extends into the trench C, which bleeds or extends into the space A, and which bleeds or extends into the space B. The non-conductive adhesive layer 15 includes the portion 152 which bleeds or extends to surround parts of the portion 141 of the lid 14. The portion 152 surrounds parts of the portion 151. The portion 152 surrounds the conductive adhesive layer 16. The trench C may serve as a constraint structure to constrain the portion 152 of the non-conductive adhesive layer 15. The non-conductive adhesive layer 15 may serve as a constraint structure to constrain the conductive adhesive layer 16. The portion 152 may serve as a constraint structure to constrain the conductive adhesive layer 16. The trench C receives the portion 152 of the non-conductive adhesive layer 15.

Figure 2A:
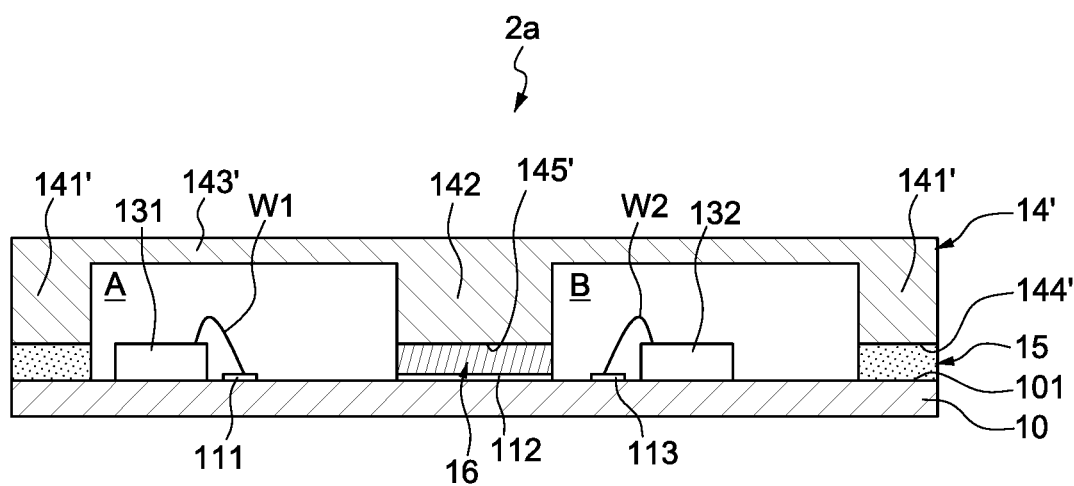
FIG. 2A is a cross-sectional view of a semiconductor device package in accordance with some embodiments of the present disclosure.

FIG. 2A is a cross-sectional view of a semiconductor device package 2*a* in accordance with some embodiments of the present disclosure. As shown in FIG. 2A, the semiconductor device package 2*a* is similar to the semiconductor device package 1*a* as illustrated and described with reference to FIG. 1A, except that a lid 14' includes a structure different from the lid 14, in which the portion 141 of the lid 14 between the trench C and the space A and the portion 141 of the lid 14 between the trench C and the space B as shown in FIG. 1A are omitted to form a portion 141' of the lid 14' as shown in FIG. 2A, and the trench C is omitted accordingly. The conductive adhesive layer 16 may provide a relatively reduced adhesion between the lid 14' and the carrier 10 than the non-conductive adhesive layer 15.

Figure 2B:
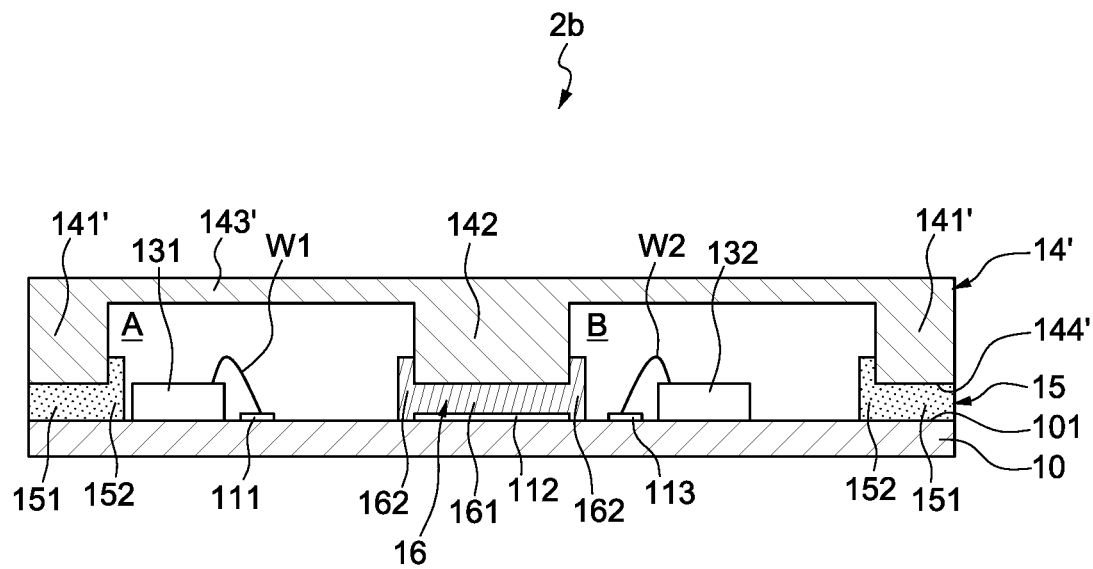
FIG. 2B is a cross-sectional view of a semiconductor device package in accordance with some embodiments of the present disclosure.

FIG. 2B is a cross-sectional view of a semiconductor device package 2*b* in accordance with some embodiments of the present disclosure. As shown in FIG. 2B, the semiconductor device package 2*b* is similar to the semiconductor device package 2*a* as illustrated and described with reference to FIG. 2A, except that the material of the conductive adhesive layer 16 has a relatively lower viscosity or is applied in a relatively greater amount, and the material of the non-conductive adhesive layer 15 has a relatively lower viscosity or is applied in a relatively greater amount.

The conductive adhesive layer 16 bleeds or extends past the intended disposition area (e.g., the bonding pad 112). The conductive adhesive layer 16 bleeds or extends into the space A. The conductive adhesive layer 16 also bleeds or extends into the space B. The conductive adhesive layer 16 includes the portion 161 between the portion 142 of the lid 14' and the bonding pad 112. The conductive adhesive layer 16 also includes the portion 162 which bleeds or extends into the space A, and which bleeds or extends into the space B. The portion 162 surrounds the portion 142 of the lid 14'. The portion 162 surrounds the portion 161. The space A receives the portion 162 of the conductive adhesive layer 16, and the space B receives the portion 162 of the conductive adhesive layer 16.

The non-conductive adhesive layer 15 bleeds or extends past the intended disposition area. The non-conductive adhesive layer 15 bleeds or extends into the space A. The non-conductive adhesive layer 15 also bleeds or extends into the space B. The non-conductive adhesive layer 15 includes the portion 151 between the portion 141' of the lid 14' and the intended disposition area (not denoted). The non-conductive adhesive layer 15 also includes the portion 152, which bleeds into the space A, and which bleeds into the space B. The non-conductive adhesive layer 15 includes the portion 152 which bleeds or extends to surround parts of the portion 141' of the lid 14'. The portion 152 surrounds parts of the portion 151.

Figure 3A:
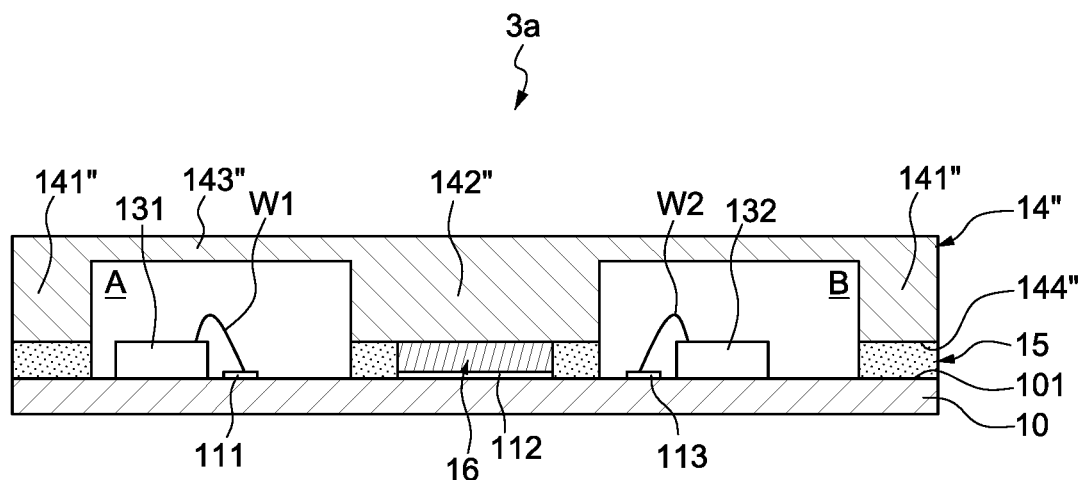
FIG. 3A is a cross-sectional view of a semiconductor device package in accordance with some embodiments of the present disclosure.

FIG. 3A is a cross-sectional view of a semiconductor device package 3*a* in accordance with some embodiments of the present disclosure. As shown in FIG. 3A, a conductive lid 14" is attached to the carrier 10 by way of the non-conductive adhesive layer 15 (e.g., an epoxy) applied between the lid 14" and the carrier 10, and the conductive adhesive layer 16 (e.g., a conductive epoxy) applied between the lid 14" and the bonding pad 112 on the carrier 10.

Figure 3B:
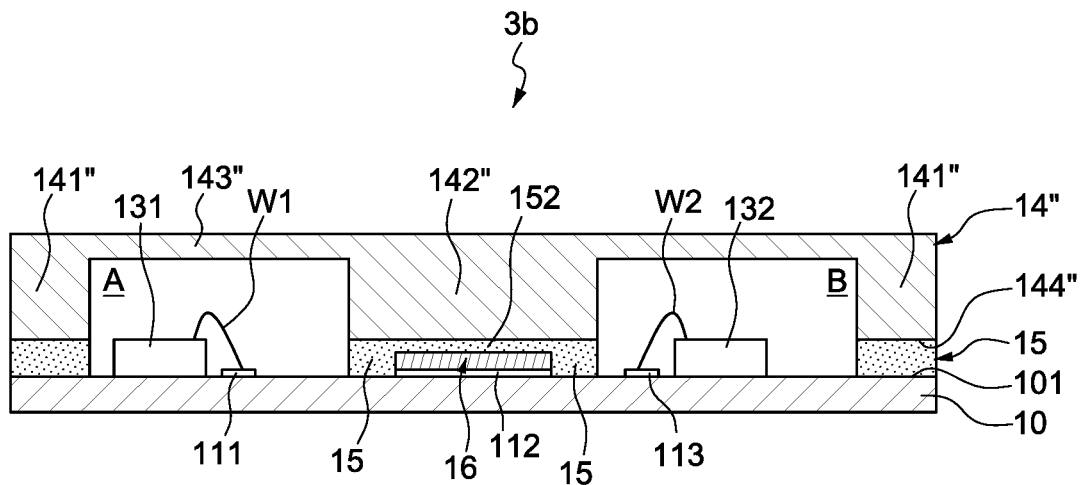
FIG. 3B is a cross-sectional view of a semiconductor device package in accordance with some embodiments of the present disclosure.

FIG. 3B is a cross-sectional view of a semiconductor device package 3*b* in accordance with some embodiments of the present disclosure. As shown in FIG. 3B, the semiconductor device package 3*b* is similar to the semiconductor device package 3*a* as illustrated and described with reference to FIG. 3A, except that the non-conductive adhesive layer 15 bleeds or extends over (and/or diffuses with) the conductive adhesive layer 16 over the bonding pad 112, resulting in a fully open circuit condition in a conductive path between the lid 14" and the bonding pad 112. In other scenarios, a partially open circuit results from bleeding of the non-conductive adhesive layer 15 and/or diffusion of the non-conductive adhesive layer 15 with the conductive adhesive layer 16.

Figure 3C:
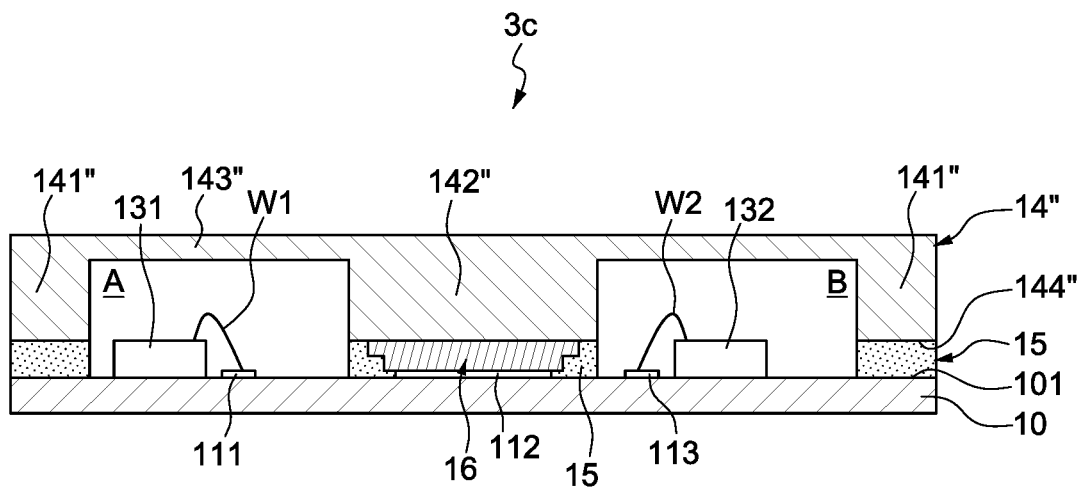
FIG. 3C is a cross-sectional view of a semiconductor device package in accordance with some embodiments of the present disclosure.

FIG. 3C is a cross-sectional view of a semiconductor device package 3*c* in accordance with some embodiments of the present disclosure. As shown in FIG. 3C, the semiconductor device package 3*c* is similar to the semiconductor device package 3*a* as illustrated and described with reference to FIG. 3A, except that the conductive adhesive layer 16 bleeds or extends into (and/or diffuses with) the non-conductive adhesive layer 15 beyond an intended disposition area for the conductive adhesive layer 16 on the bonding pad 112, which may result in a corresponding reduced adhesion between the lid 14" and the carrier 10.

Figure 3D:
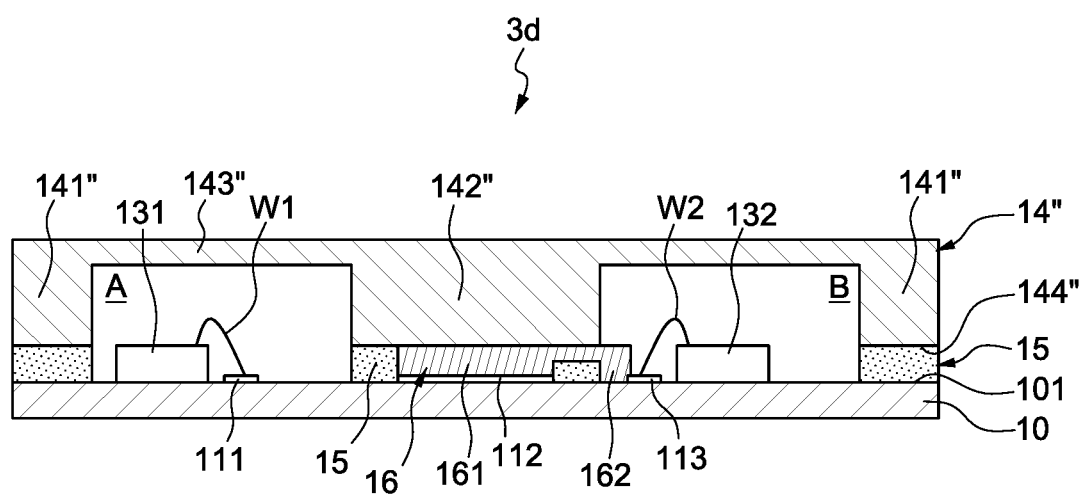
FIG. 3D is a cross-sectional view of a semiconductor device package in accordance with some embodiments of the present disclosure.

FIG. 3D is a cross-sectional view of a semiconductor device package 3*d* in accordance with some embodiments of the present disclosure. As shown in FIG. 3D, the semiconductor device package 3*d* is similar to the semiconductor device package 3*a* as illustrated and described with reference to FIG. 3A, except that the conductive adhesive layer 16 bleeds or extends over (and/or diffuses with) the non-conductive adhesive layer 15 beyond an intended disposition area for the conductive adhesive layer 16 on the bonding pad 112, which may result in a corresponding reduced adhesion between the lid 14″ and the carrier 10. The conductive adhesive layer 16 further bleeds and/or diffuses to a nearby conductive area (e.g., the bonding pad 113) on the carrier 10, resulting in a short circuit between the bonding pad 112 and the nearby conductive area (e.g., the bonding pad 113).

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. Typically, an electrically non-conductive or insulating material is one having a conductivity below the above-stated range, such as no greater than $10^{-6}$ S/m, no greater than $10^{-7}$ S/m, or no greater than $10^{-8}$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
    a carrier comprising a surface including a non-conductive area and a conductive area;
    a conductive lid disposed on the carrier;
    a conductive adhesive layer between the conductive area and the conductive lid;
    a non-conductive adhesive layer between the surface of the carrier and the conductive lid; and
    a constraint structure between the non-conductive area and the conductive area of the carrier to constrain the conductive adhesive layer and the non-conductive adhesive layer;
    wherein the conductive lid comprises a first portion and a second portion separated from the first portion on the surface of the carrier, and wherein the second portion defines a space;
    wherein the conductive lid defines a trench between the first portion and the second portion of the conductive lid; and
    wherein the non-conductive adhesive layer comprises a first portion in the trench.

2. The semiconductor device package of claim 1, wherein the conductive adhesive layer is in contact with the non-conductive adhesive layer.

3. The semiconductor device package of claim 1, further comprising an electronic component located in the space.

4. The semiconductor device package of claim 1, wherein a second portion of the non-conductive adhesive layer is disposed between the second portion of the conductive lid and the surface of the carrier.

5. The semiconductor device package of claim 1, wherein a first portion of the conductive adhesive layer is disposed between the first portion of the conductive lid and the conductive area.

6. A semiconductor device package, comprising:
a carrier comprising a surface including a non-conductive area and a conductive area;
a conductive lid disposed on the carrier;
a conductive adhesive layer between the conductive area and the conductive lid;
a non-conductive adhesive layer between the surface of the carrier and the conductive lid; and
a constraint structure between the non-conductive area and the conductive area of the carrier to constrain the conductive adhesive layer and the non-conductive adhesive layer;
wherein the conductive lid comprises a first portion and a second portion separated from the first portion on the surface of the carrier, and wherein the second portion defines a space;
wherein the conductive lid defines a trench between the first portion and the second portion of the conductive lid; and
wherein the conductive adhesive layer comprises a portion in the trench.

7. A semiconductor device package, comprising:
a carrier comprising a surface including a non-conductive area and a conductive area;
a conductive lid disposed on the carrier;
a conductive adhesive layer between the conductive area and the conductive lid;
a non-conductive adhesive layer between the surface of the carrier and the conductive lid; and
a constraint structure between the non-conductive area and the conductive area of the carrier to constrain the conductive adhesive layer and the non-conductive adhesive layer;
wherein the conductive lid comprises a first portion and a second portion separated from the first portion on the surface of the carrier, and wherein the second portion defines a space;
wherein the conductive lid defines a trench between the first portion and the second portion of the conductive lid; and
wherein the trench surrounds the first portion of the conductive lid.

* * * * *